(12) United States Patent
Coolbaugh et al.

(10) Patent No.: US 7,112,535 B2
(45) Date of Patent: Sep. 26, 2006

(54) PRECISION POLYSILICON RESISTOR PROCESS

(75) Inventors: Douglas D. Coolbaugh, Essex Junction, VT (US); Heidi L. Greer, Essex Junction, VT (US); Robert M. Rassel, Colchester, VT (US)

(73) Assignee: International Business Machines Corporation, Armonk, NY (US)

(*) Notice: Subject to any disclaimer, the term of this patent is extended or adjusted under 35 U.S.C. 154(b) by 163 days.

(21) Appl. No.: 10/605,439

(22) Filed: Sep. 30, 2003

(65) Prior Publication Data

US 2005/0070102 A1    Mar. 31, 2005

(51) Int. Cl.
*H01L 21/302* (2006.01)
(52) U.S. Cl. .................. 438/721; 438/649; 438/651; 438/720
(58) Field of Classification Search .......... 438/238, 438/244, 246, 647, 649, 651, 682, 706, 720, 438/721
See application file for complete search history.

(56) References Cited

U.S. PATENT DOCUMENTS

| | | | |
|---|---|---|---|
| 4,256,515 A | 3/1981 | Miles et al. | |
| 4,502,894 A | 3/1985 | Seto et al. | |
| 4,604,789 A | 8/1986 | Bourassa | |
| 4,679,170 A | 7/1987 | Bourassa et al. | |
| 4,929,570 A | 5/1990 | Howell | |
| 5,506,158 A | 4/1996 | Eklund | |
| 5,554,554 A | 9/1996 | Bastani et al. | |
| 5,585,302 A | 12/1996 | Li | |
| 5,656,524 A * | 8/1997 | Eklund et al. | 438/238 |
| 6,027,964 A * | 2/2000 | Gardner et al. | 438/238 |
| 6,069,398 A * | 5/2000 | Kadosh et al. | 257/538 |
| 6,184,103 B1 | 2/2001 | Li et al. | |
| 6,249,029 B1 | 6/2001 | Bryant et al. | |
| 6,255,185 B1 | 7/2001 | Coolbaugh et al. | |
| 6,399,456 B1 | 6/2002 | Huang et al. | |
| 6,400,252 B1 | 6/2002 | Smith et al. | |
| 6,436,747 B1 * | 8/2002 | Segawa et al. | 438/197 |

FOREIGN PATENT DOCUMENTS

JP    5275619    10/1993

OTHER PUBLICATIONS

C.H. Lee, IBM Disclosure Bulletin "Polysilicon Resistors Compatible with Bipolar Integrated Circuits ad Method of Manufacture", vol. 25, No. 5, Oct. 1982.

G.R. Goth, et al., IBM Disclosure Bulletin "Planar Self-Aligned Metal/Sidewall and Polysilicon-Resistor Process", vol. 25, No. 2, Jul. 1982.

* cited by examiner

*Primary Examiner*—Lan Vinh
(74) *Attorney, Agent, or Firm*—Scully, Scott, Murphy & Presser, P.C.; William D. Sabo, Esq.

(57) ABSTRACT

A process is disclosed for fabricating precision polysilicon resistors which more precisely control the tolerance of the sheet resistivity of the produced polysilicon resistors. The process generally includes performing an emitter/FET activation rapid thermal anneal (RTA) on a wafer having partially formed polysilicon resistors, followed by steps of depositing a protective dielectric layer on the polysilicon, implanting a dopant through the protective dielectric layer into the polysilicon to define the resistance of the polysilicon resistors, and forming a silicide.

19 Claims, 4 Drawing Sheets

PRECISION POLYSILICON RESISTOR PROCESS

BACKGROUND OF INVENTION

1. Field of the Invention

The present invention relates to polysilicon resistors, and more particularly to a process for fabricating precision polysilicon resistors for use in all integrated circuits. More specifically, the present invention provides a process for fabricating polysilicon resistors in which the tolerances of the sheet resistivity of each resistor across the surface of a single substrate are more precisely controlled.

2. Background of the Invention

Polycrystalline silicon resistors, also called polysilicon or polySi resistors, have been used in the electronic circuit industry for many years. Depending upon their doping and doping levels, p+, n+, p− and n− polysilicon resistors can be fabricated. P+ polysilicon resistors are extremely advantageous for use in analog circuit designs due to their desirable figures of merits. Typically, P+ polysilicon resistors are used in analog and mixed signal circuit designs because they can provide precise matching of subsequent resistors, a low temperature coefficient of resistance, a low voltage coefficient of resistance, and a low parasitic capacitance.

Although polysilicon resistors are widely used in analog circuit designs, such resistors generally have high sheet resistance tolerances ranging from 15–20%. This means the sheet resistance changes by +/−15 to 20%. In current analog and mixed signal applications, and in order to meet stringent circuit performance requirements, circuit designers are demanding lower tolerances in polysilicon resistors.

In the current state of the art, polysilicon resistors are fabricated by ion implanting dopants into a polysilicon layer during the source/drain (S/D) implant step and/or emitter implant step. The implanted dopants in the various regions are then activated utilizing a rapid thermal anneal process. Next, a dielectric layer such as a nitride is applied to the body of the polysilicon resistor so as to protect the body of the polysilicon resistor from being silicided in a subsequent silicidation step. The ends of the polysilicon resistors are then typically exposed and silicided by employing a conventional silicidation process that includes depositing a metal atop the exposed polysilicon end portions and annealing. A single or two-step anneal process may be used in forming the silicide depending on the type of metal that is deposited. The two-step anneal typically includes a silicidation formation anneal and a silicidation transformation anneal.

FIGS. 1A–1D are simple pictorial representations of the above described prior art process of fabricating polysilicon resistors. In these drawings, only a single polysilicon resistor device region is shown. Other device regions including other polysilicon resistor device regions, CMOS (complementary metal oxide semiconductor) device regions and/or bipolar transistor device regions may be formed adjacent to the resistor device region shown. The various device regions are typically isolated from each other by an isolation region, such as a trench isolation region or field oxide region formed in the substrate.

The initial structure shown in FIG. 1A includes semiconductor substrate 10, an optional first dielectric layer 12 located on the upper surface of the semiconductor substrate 10, a polysilicon layer 14 located on either an upper surface of the optional first dielectric layer 12 or an upper surface of the semiconductor substrate 10, and a second dielectric layer 16 located atop the polysilicon layer 14.

In the prior art process, and as shown in FIG. 1A, ions 18 are next implanted into the polysilicon layer 14 within the polysilicon resistor device region through second dielectric layer 16. Note that the ions 18 are also being implanted into other device regions present on the substrate 10. For example, ions 18 may be implanted into the CMOS device regions and/or the bipolar transistor device regions. The implanted ions within the CMOS device regions are used in forming source/drain regions and/or doping of a polysilicon gate conductor, while the ions being implanted into the bipolar device regions are used for doping the polysilicon emitter.

Following this ion implantation step, the dopants within the various device regions are activated using an activation annealing process. FIG. 1B shows the structure after ion implantation and activation annealing. In this figure, reference numeral 14a denotes a doped polysilicon layer.

Next, a protective dielectric 20 is formed atop the second dielectric 16 providing the structure shown in FIG. 1C. Ends of the protective dielectric 20 and second dielectric layer 16 in the resistor device region are removed by lithography and etching to expose a surface portion of the doped polysilicon 14a. The exposed surface portions of the doped polysilicon are then subjected to a silicidation process in which silicide contact regions 22 are formed. The resultant structure including the silicide contact regions 22 is shown, for example, in FIG. 1D.

The above described prior art process of fabricating polysilicon resistors results in undesirable high tolerance resistors having across wafer variations or tolerances in sheet resistance in excess of +/−15–20%. Moreover, in the foregoing described prior art process for fabricating polysilicon resistors, it is generally hard to control the sheet resistance value of the resistors, primarily because of the dopant activation/deactivation and movement in and out of the polysilicon grain boundaries due to subsequent thermal cycles.

In view of the above drawbacks with the prior art process of fabricating polysilicon resistors, particularly the difficulties in controlling the resistance tolerances of polysilicon resistors, there is a need for developing a new and improved process in which precise polysilicon resistors can be fabricated that more precisely controls the tolerances of the sheet resistivity of each polysilicon resistor being fabricated.

SUMMARY OF INVENTION

An object of the present invention is to provide a process for fabricating polysilicon resistors which may be integrated with other types of devices including, for example, bipolar transistors and/or CMOS devices including FETs.

A further object of the present invention is to provide a process for fabricating precision polysilicon resistors in which the tolerances of the sheet resistivity of each resistor is controlled.

A yet further object of the present invention is to provide a process for fabricating precision polysilicon resistors that have sheet resistance tolerances that are less than currently manufactured polysilicon resistors.

A still further object of the present invention is to provide a process for fabricating precision polysilicon resistors that have a desired and predetermined resistance value which is substantially maintained after device fabrication.

An even further object of the present invention is to provide a process for fabricating precision polysilicon resistors that have tolerances of +/−5–8% which meet current circuit design requirements.

These and other objects and advantages are achieved in the present invention by employing a process wherein the polysilicon resistor implant, which is used to define the value of a desired resistance to a resistor, is performed after the ion implantation and thermal activation of other devices such as FETs and/or bipolar transistors. Prior to the polysilicon resistor implant and following the implant and thermal activation of dopants within the other device regions, a dielectric film is deposited to protect the polysilicon resistor during a subsequent silicide process. The polysilicon resistor implant occurs through the dielectric film to minimize thermal cycling that moves the dopant in and out of the crystal lattice and the polysilicon grain boundaries.

The present invention provides a process for fabricating precision polysilicon resistors which are particularly applicable to CMOS and BiCMOS technologies, and can be applied to technologies with or without silicide processing.

The process of the present invention produces precision polysilicon resistors that have wide applicability in analog and mixed circuit technologies, have a low temperature coefficient of resistance, a low voltage coefficient of resistance, and low parasitic capacitance. The process of the present invention improves all of the components of variance, thus providing a lower tolerance polysilicon resistor.

In broad terms, the process of the present invention comprises: providing a structure that includes at least one polysilicon resistor device region and at least one other type of device region, said at least one polysilicon resistor device region comprising a polysilicon layer; selectively performing an ion implant and an activation anneal in the at least one other type of device region; forming a protective dielectric layer overlying said polysilicon layer in said at least one polysilicon resistor device region; and providing a predetermined and desired resistance value to said polysilicon layer in said at least one polysilicon resistor device region.

DETAILED DESCRIPTION

Figure 1A:
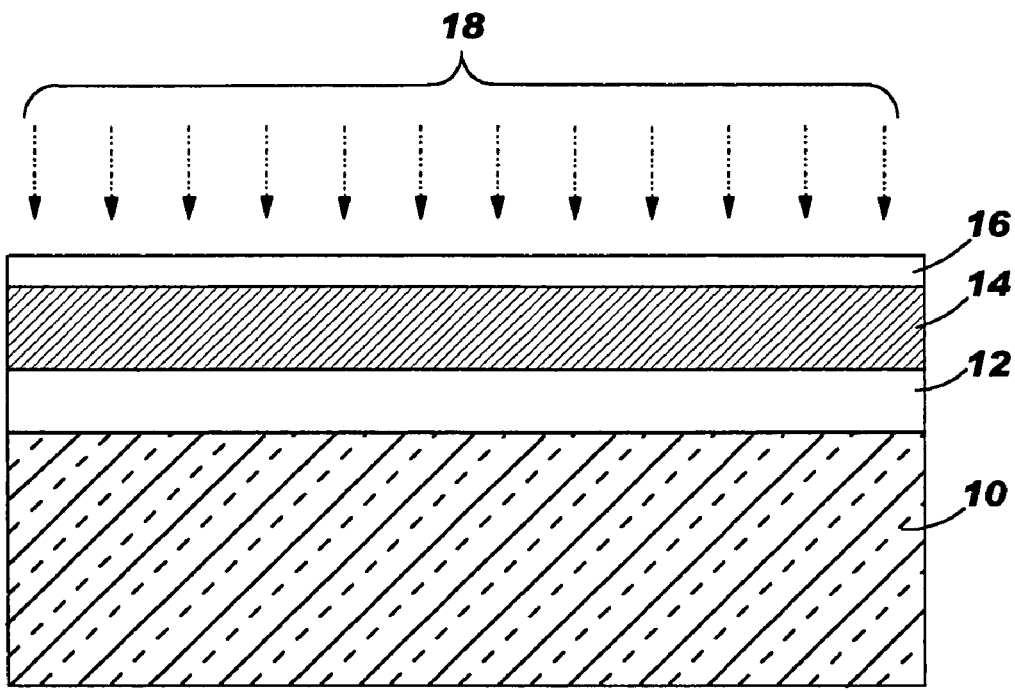
FIGS. 1A–1D are pictorial representations (through cross sectional views) illustrating the basic processing steps that are employed in the prior art for fabricating polysilicon resistors.
Figure 1B:
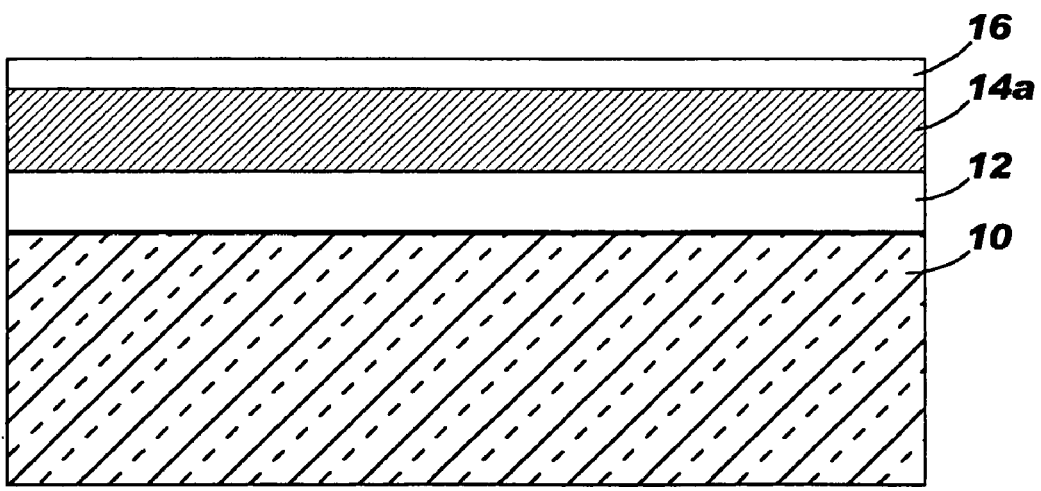
Figure 1C:
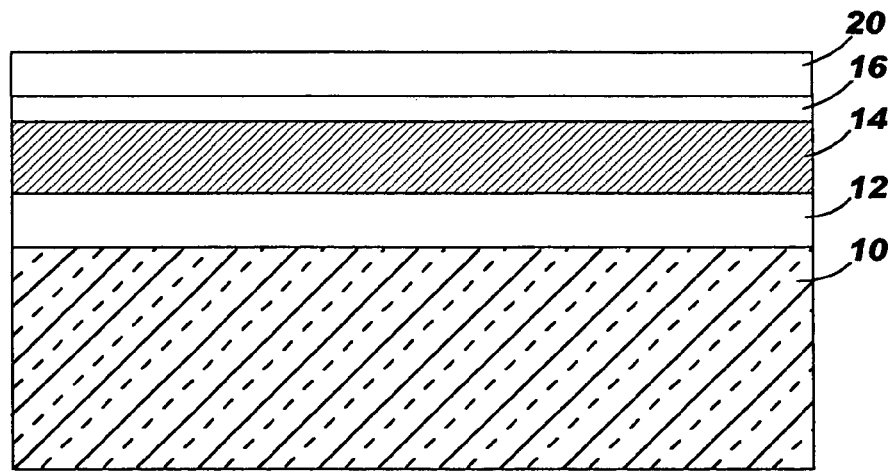
Figure 1D:
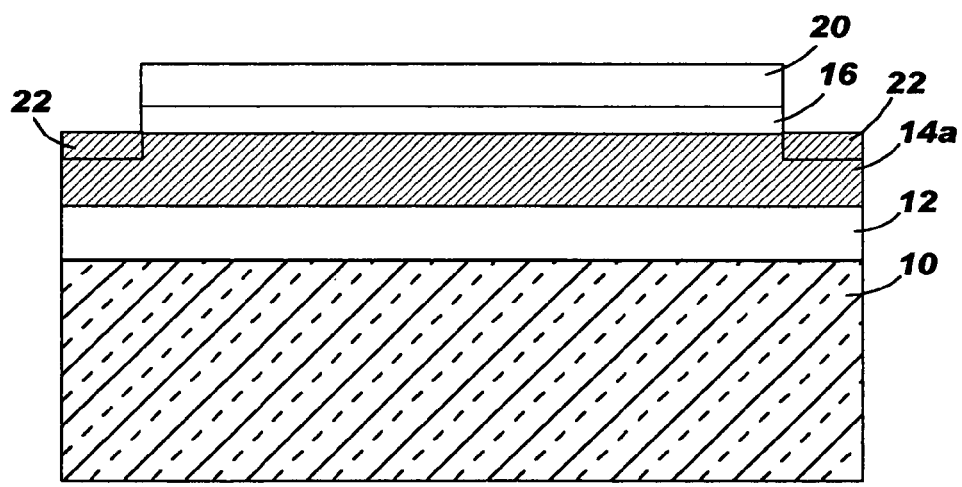

The present invention, which provides a process for fabricating precision polysilicon resistors that have controlled tolerances of sheet resistivity, will now be described in greater detail by referring to FIGS. 2A–2D that accompany the present application. In the accompanying drawings, like and/or corresponding elements are referred to by like reference numerals.

It is noted that the drawings of the present invention show a fragment of a semiconductor wafer or chip in which only one polysilicon resistor device region is shown. Although the drawings show the presence of only a single polysilicon resistor device region, the present process can be used in forming a plurality of precision polysilicon resistors across the surface of a single semiconductor chip or wafer. Additionally, the process of the present invention can be integrated with any conventional CMOS, bipolar, BiCMOS (bipolar and CMOS) processing scheme. Thus, other device regions including bipolar transistors and/or FETs can be formed to the periphery of the polysilicon device region shown in the drawings of the present application.

Figure 2A:
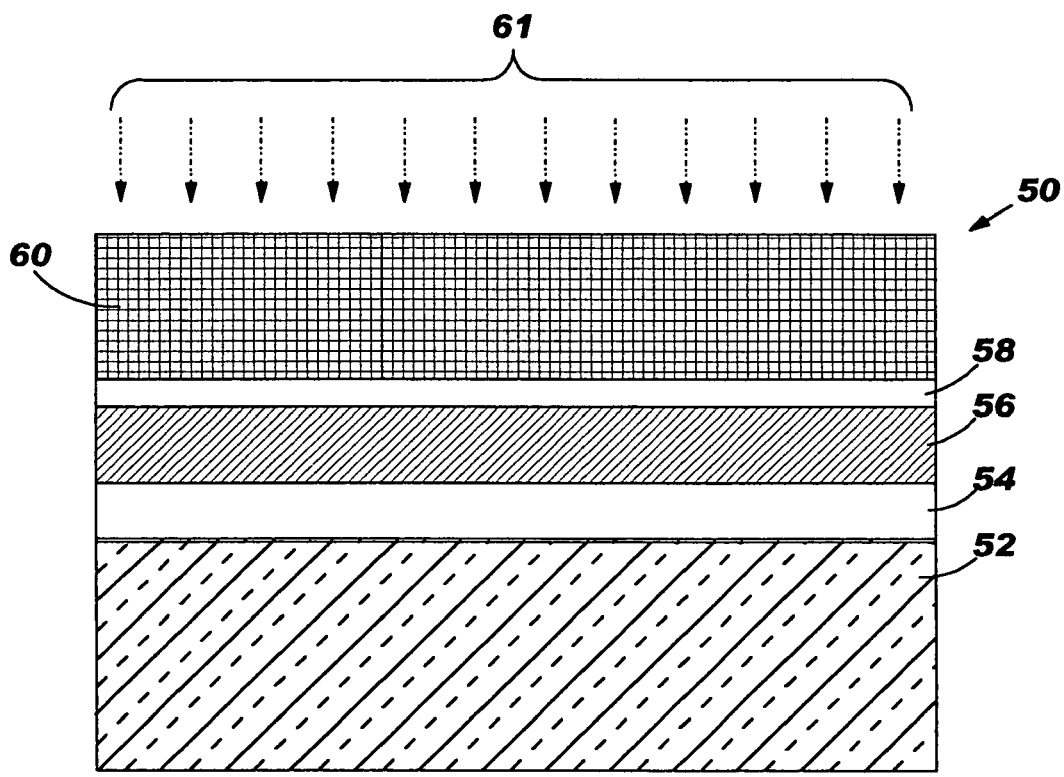
FIGS. 2A–2D are pictorial representations (through cross sectional views) illustrating the basic processing steps that are employed in the present invention for fabricating precision polysilicon resistors.

Reference is first made to the initial structure 50 (i.e., a partial polysilicon resistor) shown in FIG. 2A. The initial structure 50 includes semiconductor substrate 52, optional first dielectric layer 54 located on the semiconductor substrate 52, a polysilicon layer 56 located on either the optional first dielectric layer 54 or the semiconductor substrate 52, second dielectric layer 58 located on the polysilicon layer 56 and patterned photoresist mask 60 located on the second dielectric layer 58. In accordance with the present invention, the patterned photoresist mask 60 is positioned atop regions of semiconductor substrate 52 in which polysilicon resistors are to be formed. The other device areas do not typically include the patterned photoresist mask 60 thereon.

The semiconductor substrate 52 of the initial structure 50 shown in FIG. 2A comprises any semiconductor material including, but not limited to: Si, Ge, SiGe, SiC, SiCGe, Ga, GaAs, InAs, InP, silicon-on-insulators, SiGe-on-insulators and all other III/V compound semiconductors. Of these semiconducting materials, it is highly preferred that semiconductor substrate 52 be composed of a Si-containing semiconductor.

The semiconductor substrate 52 may be doped, undoped or contain doped and undoped regions therein. The semiconductor substrate 52 may contain active device regions and/or device isolation regions embedded in the surface thereof. For clarity, such regions are not shown in FIG. 2A, but nevertheless the same could be present in the semiconductor substrate 52. For example, the polysilicon layer 56 can be formed directly atop an isolation region such as a trench isolation region or field oxide region that is present in or on the substrate. In such an embodiment, the optional first dielectric layer 54 is not typically formed on the isolation region.

When present, the optional first dielectric layer 54 is composed of any material that is capable of serving as an insulator between semiconductor substrate 52 and doped polysilicon region 56a to be subsequently formed. The present invention thus contemplates the use of inorganic as well as organic dielectric materials as the optional first dielectric layer 54. Suitable dielectric materials for use as the optional first dielectric layer 54 include, but are not limited to: $SiO_2$, $Si_3N_4$, perovskite-type oxides such as barium strontium titanate, diamond, diamond-like carbon, polyimides, silicon-containing polymers and other like dielectric materials. Of the dielectric materials mentioned above, it is highly preferred that the optional first dielectric layer 54 be composed of $SiO_2$ or $Si_3N_4$.

Optional first dielectric layer 54 is first formed on the surface of the semiconductor substrate 52 by either growing the dielectric layer using a thermal growing process or by depositing the dielectric layer using a deposition technique such as, for example, chemical vapor deposition (CVD), plasma-assisted chemical vapor deposition, spin-on coating, dip coating and other deposition processes known to those skilled in the art. While not critical to the present invention, the final thickness of the optional first dielectric layer 54 is from about 100 to about 3000 Å. If needed, the structure containing the semiconductor substrate 52 and the optional first dielectric layer 54 can be planarized using a planarization technique known to those skilled in the art such as, for example, chemical-mechanical polishing (CMP) or grinding.

Next, the polysilicon layer 56 is formed on the surface of the optional first dielectric layer 54 or the semiconductor substrate 52 (when the optional first dielectric layer 54 is not present) using a deposition technique known to those skilled in the art. For example, chemical vapor deposition, plasma-assisted chemical vapor deposition or sputtering may be used to form the polysilicon layer 56. The polysilicon layer 56 formed outside the resistor device region shown in the drawings of the present invention can be used in forming the emitter of a bipolar transistor, and/or a gate conductor of a CMOS device. A highly preferred means for depositing the polysilicon layer 56 is by the pyrolysis of a silane at low temperatures such as between 600° to 750° C. The thickness of the polysilicon layer 56, which is also not critical to the present invention, is typically of from about 500 to about 3000 Å.

A second dielectric 58, which is comprised of an inorganic dielectric such as an oxide, nitride, oxynitride or any combination thereof, is then formed atop the polysilicon layer 56. The second dielectric layer 58 is preferably an oxide such as $SiO_2$. The second dielectric layer 58 is formed utilizing one of the techniques mentioned above in forming the optional first dielectric layer 54.

A patterned photoresist mask 60 is then formed atop the second dielectric layer 58 in the polysilicon resistor device region. In accordance with the present invention, the patterned photoresist mask 60 is required in each resistor device region at this point of the present invention to protect the polysilicon layer 56 in each resistor device region from receiving dopants used in forming the other device regions.

The lithographic step includes applying a photoresist layer to the structure, exposing the photoresist layer to a pattern of radiation and developing the pattern into the photoresist layer utilizing a conventional resist developer solution.

The patterned photoresist mask 60 must have a sufficient thickness to prevent dopant ions from being implanted into the polysilicon layer 56 within each resistor device region during the subsequent doping of the polysilicon emitter and/or polysilicon gate and/or S/D formation. FIG. 2A also shows the presence of dopant ions 61 (either p-type or n-type) which are not being implanted into each polysilicon resistor device region at this point of the present invention due to the presence of the patterned photoresist 60 overlying the polysilicon layer 56. The dopant ions 61 would however be implanted into the emitter polysilicon of a bipolar transistor and/or the polysilicon gate of a FET and/or substrate for forming S/D regions. Following implantation of dopant ions into the polysilicon emitter and/or polysilicon gate and/or the substrate, the dopant ions are activated in those regions by performing an activation anneal step.

Figure 2B:
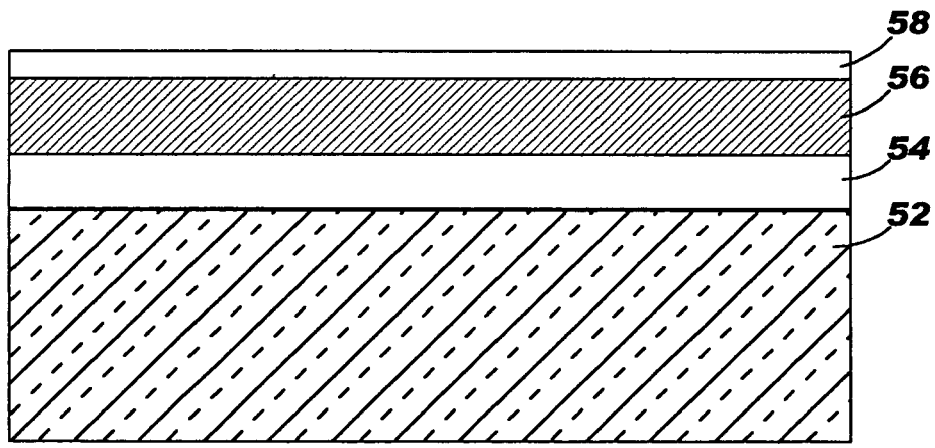

After ion implantation the patterned photoresist mask 60 is removed from the structure providing the structure shown, for example, in FIG. 2B, and activation of the dopant ions within the bipolar and/or CMOS device regions is performed. As shown, the second dielectric layer 58 is now exposed. The patterned photoresist mask 60 is removed utilizing a conventional stripping process well known to those skilled in the art.

Figure 2C:
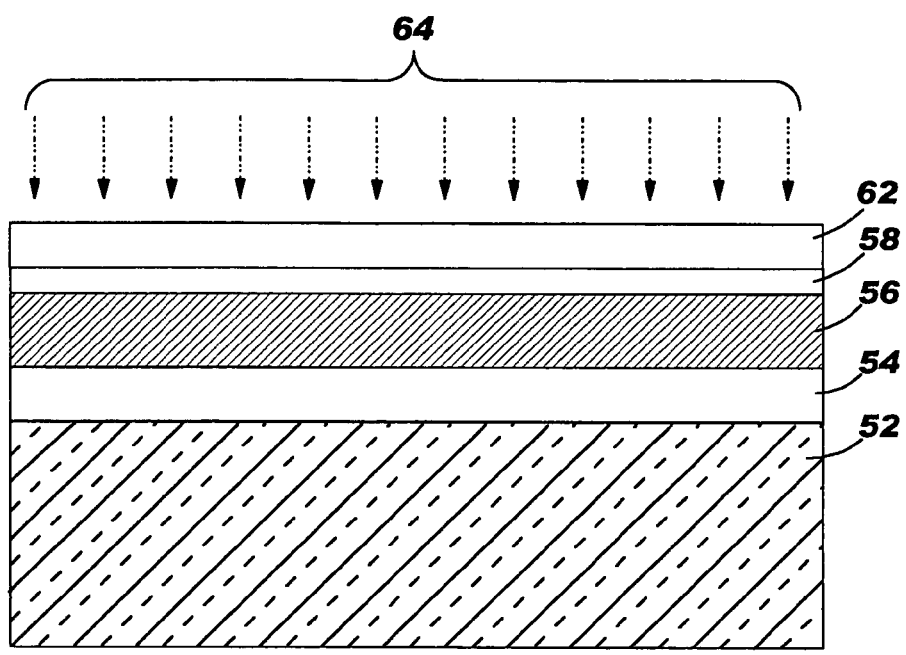

Next, a protective dielectric layer 62 is formed across the entire structure including the exposed second dielectric layer 58 in the polysilicon resistor device region (see, the structure shown in FIG. 2C). The protective dielectric layer 62 is comprised of an inorganic dielectric that differs from the second dielectric layer 58. In particular, the protective dielectric layer 62 may be comprised of an oxide, nitride, oxynitride or any combination thereof. The protective dielectric layer 62 is preferably a nitride such as SiN. The protective dielectric layer 62 is formed utilizing one of the techniques mentioned above in forming the optional first dielectric layer 54. The thickness of protective dielectric 62 may vary, but typically the protective dielectric layer 62 has a thickness of from about 10 to about 1000 Å.

Dopant ions 64 are then implanted into the polysilicon layer 56 of each polysilicon resistor device region through protective dielectric layer 62 and the second dielectric layer 58 as shown in FIG. 2C. The dopant ions 64 are implanted to provide a dopant concentration of from about $1\times10^{14}$ to about $1\times10^{21}$ atoms/cm$^3$ within the polysilicon layer 56 in each resistor device region. The particular doping concentration can be selected to provide a predetermined and desired resistance value to the polysilicon layer 56.

Any conventional n-type or p-type dopant ion may be used at this point of the present invention. Thus, the present invention is capable of forming p−, p+, n−, n+ polysilicon resistors. Preferably, p+ polysilicon resistors are formed in the present invention. After doping of the polysilicon layer 56 within each resistor device region, the structure is typically annealed at temperatures which are sufficient to activate the dopants implanted into the polysilicon layer 56 forming doped and activated polysilicon layer 56a (see, the structure shown in FIG. 2D). In some embodiments of the present invention, the activation of the dopants within the doped polysilicon layer 56 can be delayed and performed during another subsequent thermal event. For example, the activation of dopants within the polysilicon layer 56 may be carried out during the silicidation anneal.

If a separate anneal is used to activate the dopants within the polysilicon layer 56, the anneal is typically carried out at this point of the present invention using a furnace anneal or a rapid thermal anneal (RTA). Typically, this annealing step is carried out in an inert gas atmosphere, e.g. He, Ar and $N_2$, that may be mixed with less than about 10% oxygen. It is also possible to use an oxidizing ambient in place of an inert gas atmosphere during the annealing of the polysilicon resistor.

The exact temperatures and times of annealing vary depending on the annealing technique used as well as the type of dopant found in the polysilicon layer 56. For example, when a furnace anneal is employed and B is used as the dopant species, annealing is carried out at a temperature of about 900° C. for a time period of about 20 minutes. For the same dopant species, RTA is carried out at about 950° C. for about 7 seconds. On the other hand, when As is the dopant species, the furnace anneal is carried out at about 750° C. for about 20 minutes. Reduced annealing times can be employed when RTA is used in activating As.

In some embodiments of the present invention, the protective dielectric layer 62 and the second dielectric layer 58 are then patterned by lithography and etched to expose end surface regions of the doped polysilicon layer 56a. A conductive metal that is capable of being converting into a silicide by reacting with the underlying and contacting doped polysilicon layer 56a is then formed on each exposed end surface region. Examples of conductive metals that can be employed in the present invention include, but are not limited to: Ni, Ti, W, Co, and other like metals, including alloys thereof. Highly preferred metals include Ti and Co. The thickness of the conductive metal formed at this point of the present invention may vary. A typical thickness range for the conductive metal is from about 100 to about 500 Å.

The conductive metals can be formed utilizing any deposition process known to those skilled in the art. Illustrative examples of suitable deposition processes that can be used in forming the conductive metal include, but are not limited to: sputtering, atomic layer deposition, evaporation, chemical vapor deposition, chemical solution deposition and other like deposition processes.

After conductive metal deposition, the structure is subjected to a silicidation anneal, which may include a one or two-step anneal. The silicidation annealing conditions may vary depending on the conductive metal that was previously deposited. Such annealing conditions are well known to those skilled in the art. It is noted that if not previously done, the silicidation anneal may also be used to activate the dopants within the doped polysilicon layer 56a.

The silicide anneals are self-aligned processes that are carried out in a gas atmosphere, e.g., He, Ar, $N_2$ or forming gas. The silicide annealing steps may use different atmospheres or the annealing steps may be carried out in the same atmosphere. For example, He may be used in both annealing steps, or He can be used in the first annealing step and a forming gas may be used in the second annealing step.

The one step anneal is performed at a temperature of from about 300° to about 800° C. More preferably, the one step anneal is performed at a temperature of from about 500° to about 700° C. The one step anneal is typically employed when Ni is used as the conductive metal. An etching step may follow the one step silicide anneal to remove any unreacted metal from the structure.

The two-step annealing process includes a first annealing step and a second annealing step. An etching step is typically performed between the two anneals to remove any unreacted metal. Typically, the first annealing step, which forms a high resistance silicide phase material, is performed at a temperature of from about 400° to about 600° C. using a continuous heating regime or various ramp and soak heating cycles. More preferably, the first annealing step is performed at a temperature of from about 450° to about 550° C. The second annealing step is performed at a temperature of from about 600° C. to about 900° C. using a continuous heating regime or various ramp and soak heating cycles. More preferably, the second annealing step is performed at a temperature of from about 700° C. to about 800° C. for cobalt conversion to a final low resistivity $CoSi_2$ phase. The second anneal converts the high resistance silicide into a silicide phase of lower resistance and these temperatures are well known by those skilled in the art for various conductive metals.

Figure 2D:
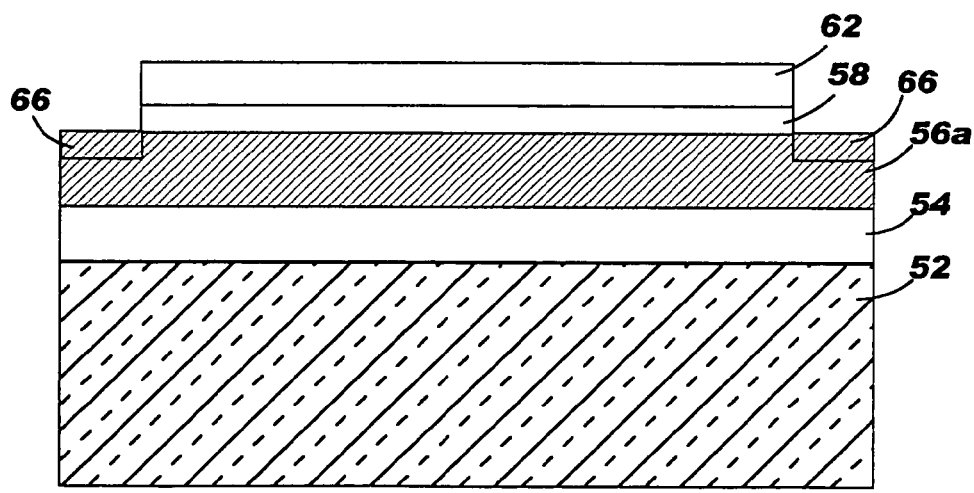

The resultant structure after the silicide anneals have been performed is shown, for example, in FIG. 2D. Reference numeral 66 denotes the silicide contact regions formed utilizing the above steps. Depending on the device being manufactured, it is possible to complete formation of the bipolar transistors and/or CMOS devices after silicide formation using well known FEOL (front-end-of-the-line) processes. Additionally, a conventional BEOL (back-end-of-the-line) process may be employed at this point of the present invention to connect the silicide contact regions 66 of the polysilicon resistor to an external wire.

The above process provides polysilicon resistors that have improved, i.e., lowered, resistance tolerances. Typically, the present invention can be used to provide precision polysilicon resistors wherein the tolerance of the sheet resistivity is below 10%. Tolerance as low as +/−5–8% can be obtained using the process of the present invention.

While the present invention has been described and shown with respect to preferred embodiments thereof, it will be understood by those skilled in the art that the foregoing and other changes in forms and details may be made without departing from the spirit and scope of the present application. It is therefore intended that the present application not be limited to the exact forms described and illustrated, but fall within the scope of the appended claims.

The invention claimed is:

1. A method for fabricating a precision polysilicon resistor comprising:
   providing a structure that includes at least one polysilicon resistor device region and at least one other type of device region, said at least one polysilicon resistor device region comprising a polysilicon layer;
   selectively performing an ion implant and an activation anneal in the at least one other type of device region forming at least one of an emitter of a bipolar transistor, a polysilicon gate of a field effect transistor or source/drain regions of said field effect transistor;
   subsequently, forming a protective dielectric layer overlying said polysilicon layer in said at least one polysilicon resistor device region; and
   subsequently, providing a predetermined resistance value to said polysilicon layer in said at least one polysilicon resistor device region.

2. The method of claim 1 wherein said at least one polysilicon device region comprises a semiconductor substrate, an optional first dielectric located on the substrate, said polysilicon layer located on the substrate or the optional first dielectric and a second dielectric layer located on the polysilicon layer.

3. The method of claim 1 further comprising forming a patterned photoresist atop the at least one polysilicon resistor device region to protect the region during said selective ion implant.

4. The method of claim 1 wherein said protective dielectric layer is a nitride.

5. The method of claim 1 wherein said step of providing a predetermined resistance value to said polysilicon layer comprises ion implantation into the polysilicon layer.

6. The method of claim 5 wherein said ion implantation comprises p or n-type dopants.

7. The method of claim 6 wherein said ion implantation provides said polysilicon layer with a dopant concentration of from about $1\times10^{14}$ to about $1\times10^{21}$ atom/cm$^3$.

8. The method of claim 5 further comprising an annealing step after said ion implantation.

9. The method of claim 8 wherein said annealing step is performed in an inert gas ambient that may optionally be mixed with less than about 10% oxygen.

10. The method of claim 1 further comprising exposing end portions of said polysilicon layer after said step of providing a predetermined resistance value to said polysilicon layer.

11. The method of claim 10 further comprising providing silicide contacts on the exposed polysilicon layer.

12. The method of claim 11 wherein said suicide contacts are formed using a silicidation process.

13. The method of claim 12 wherein said silicidation process comprises depositing a conductive metal and annealing to cause reaction of the conductive metal with the underlying polysilicon layer thereby forming said silicide contacts.

14. The method of claim 13 wherein said conductive metal is selected from the group consisting of Co, Ni, Ti, W and alloys thereof.

15. The method of claim 14 wherein said conductive metal is Co or Ti.

16. A process for fabricating a precision polysilicon resistor comprising:
   performing a rapid thermal anneal for an emitter/PET activation process on a wafer or chip having a partially formed polysilicon resistor having a polysilicon layer, said rapid thermal anneal forming at least one of an emitter of a bipolar transistor, a polysilicon gate of a field effect transistor or source/drain regions of said field effect transistor;

subsequently, depositing a protective layer over the polysilicon layer of the polysilicon resistor to protect the polysilicon layer against subsequent silicide processing;

subsequently, ion implanting a dopant into the polysilicon layer of the polysilicon resistor through the protective layer; and subsequently, performing silicide processing to form the precision polysilicon resistor.

17. The method of claim 16 wherein the step of performing silicide processing includes performing a silicide formation thermal anneal followed by a silicide conversion thermal anneal to activate the resistor polysilicon ion implant dopant.

18. The method of claim 16 wherein the step of performing suicide processing includes performing a silicide formation thermal anneal followed by a silicide conversion thermal anneal.

19. The method of claim 16 wherein said protective layer comprises a nitride.

* * * * *